(12) United States Patent  (10) Patent No.: US 8,550,826 B2
Hsu  (45) Date of Patent: Oct. 8, 2013

(54) SOCKET CONNECTOR ASSEMBLY HAVING REINFORCING MEMBER FOR SUPPORTING LOADING DEVICE

(75) Inventor: Shuo-Hsiu Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 219 days.

(21) Appl. No.: 13/100,307

(22) Filed: May 4, 2011

(65) Prior Publication Data

US 2011/0318943 A1 Dec. 29, 2011

(51) Int. Cl.
*H01R 12/00* (2006.01)

(52) U.S. Cl.
USPC .......................................................... 439/73

(58) Field of Classification Search
USPC .................................... 439/330, 331, 342, 73
See application file for complete search history.

(56) References Cited

U.S. PATENT DOCUMENTS

| 3,006,673 | A | * | 10/1961 | Swick | 403/122 |
| 3,263,200 | A | * | 7/1966 | Kocmich | 439/73 |
| 5,648,890 | A | * | 7/1997 | Loo et al. | 361/704 |
| 5,754,400 | A | * | 5/1998 | Sathe et al. | 361/704 |
| 6,501,658 | B2 | * | 12/2002 | Pearson et al. | 361/709 |
| 6,545,879 | B1 | * | 4/2003 | Goodwin | 361/807 |
| 6,859,367 | B2 | * | 2/2005 | Davison | 361/704 |
| 7,193,853 | B2 | * | 3/2007 | Chen et al. | 361/719 |
| 7,227,761 | B2 | * | 6/2007 | Estes et al. | 361/810 |
| 7,359,200 | B2 | * | 4/2008 | Zhou et al. | 361/704 |
| 7,402,065 | B1 | * | 7/2008 | Polnyi | 439/331 |
| 7,553,178 | B1 | * | 6/2009 | Wertz et al. | 439/331 |
| 7,628,651 | B2 | * | 12/2009 | Yeh | 439/607.37 |
| 7,684,198 | B2 | * | 3/2010 | Fang | 361/719 |
| 7,690,926 | B2 | | 4/2010 | Yeh et al. | |
| 7,870,888 | B2 | * | 1/2011 | Zhou et al. | 165/80.3 |
| 8,083,038 | B2 | * | 12/2011 | Reisel et al. | 188/300 |

* cited by examiner

*Primary Examiner* — Xuong Chung Trans
(74) *Attorney, Agent, or Firm* — Wei Te Chung; Ming Chieh Chang

(57) ABSTRACT

A loading device comprises a frame defining opposite top, bottom face, and a number of mounting holes extending through both the faces; a loading plate and a lever pivotally connected on the frame respectively, the loading plate being able to be locked on the frame by the lever; a number of screw members passing through corresponding mounting holes; a number of connecting members located below the bottom face of the frame and engaging with corresponding screw member; and a number of reinforcing members disposed between the bottom face and the connecting members for limiting movement of the frame relative to the connecting members.

14 Claims, 10 Drawing Sheets

SOCKET CONNECTOR ASSEMBLY HAVING REINFORCING MEMBER FOR SUPPORTING LOADING DEVICE

BACKGROUND OF THE INVENTION

1. Field of the Invention

The present invention relates to a socket connector assembly, and more particularly to a socket connector assembly having reinforcing member for supporting loading device thereof thus prevent the loading device from damaging a motherboard before an IC (Integrated Circuit) package is retained by the loading device.

2. Description of Prior Art

Referring to FIGS. 1-3, a conventional socket connector 8 mounted onto a motherboard 9 for electrically connecting an IC package (not shown) is shown. Similar socket connector can be also seen from disclosure of U.S. Pat. No. 7,690,926 issued to Yeh on Apr. 6, 2010. The socket connector 8 comprises an insulative housing 80 having a number of contacts (not shown) received therein, a frame 82 seated around and separated from the housing 80, a loading plate 84 and a lever 86 pivotally connected on opposite ends of the frame 82, and a number of screw members 88 for connecting the frame 82 to the motherboard 9.

The frame 82 defines an upper surface 820 for abutting against the screw member 88, a pair of sidewalls 822 extending downwardly from opposite ends of the upper side 820 of the screw member 88 toward the motherboard 9 so as to define a space between the motherboard 9 and lower surface of the frame 82 when the frame 82 is located on the motherboard 9. A number of connecting members 89 are disposed in the space and corresponding to mounting holes (not labeled) arranged on opposite end of the frame 82. The screw members 88 pass through the mounting hole and engage with the connecting member 89. The screw member 88 is further inserted into hole (not labeled) on the motherboard 9. The IC package will be disposed in the housing 80 and the loading plate 82 will cover the package. The IC package will be secured when the loading plate 84 is locked on the frame 82 by the lever 86. Furthermore, the frame 82 will be secured on the motherboard 9. The bottom end of the sidewalls 822 will be spaced from the motherboard 9 under upward force from the lever 86.

The frame 82 is separated from the housing 80. Therefore, before the loading plate 84 is secured on the frame 82 by the lever 86, the frame 82 is moveable relative to the motherboard 9 in vertical direction. Referring to FIG. 3, the sidewalls 822 will seat on the motherboard 9 before the loading plate 84 is locked thus may damage the motherboard 9.

In view of the above, a socket connector with improved standoff-equipped stiffener that overcomes the above-mentioned disadvantages is desired.

SUMMARY OF THE INVENTION

Accordingly, an object of the present invention is to provide a socket connector assembly having reinforcing member for supporting loading device thereof thus prevent the loading device from destroying motherboard before the loading device is secured on motherboard.

To achieve the above-mentioned object, a loading device comprises a frame defining opposite top, bottom face, and a number of mounting holes extending through both the faces; a loading plate and a lever pivotally connected on the frame respectively, the loading plate being able to be locked on the frame by the lever; a number of screw members passing through corresponding mounting holes; a number of connecting members located below the bottom face of the frame and engaging with corresponding screw member; and a number of reinforcing members disposed between the bottom face and corresponding connecting members for limiting movement of the frame relative to the connecting members in vertical direction. When above-mentioned loading device is cooperated with a housing having a number of contacts, a socket connector for electrically connecting an IC package is formed. When such socket connector is mounted onto a motherboard, the loading device will not contact the motherboard under work or non-work status thus damage of the motherboard will be avoided.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Figure 1:
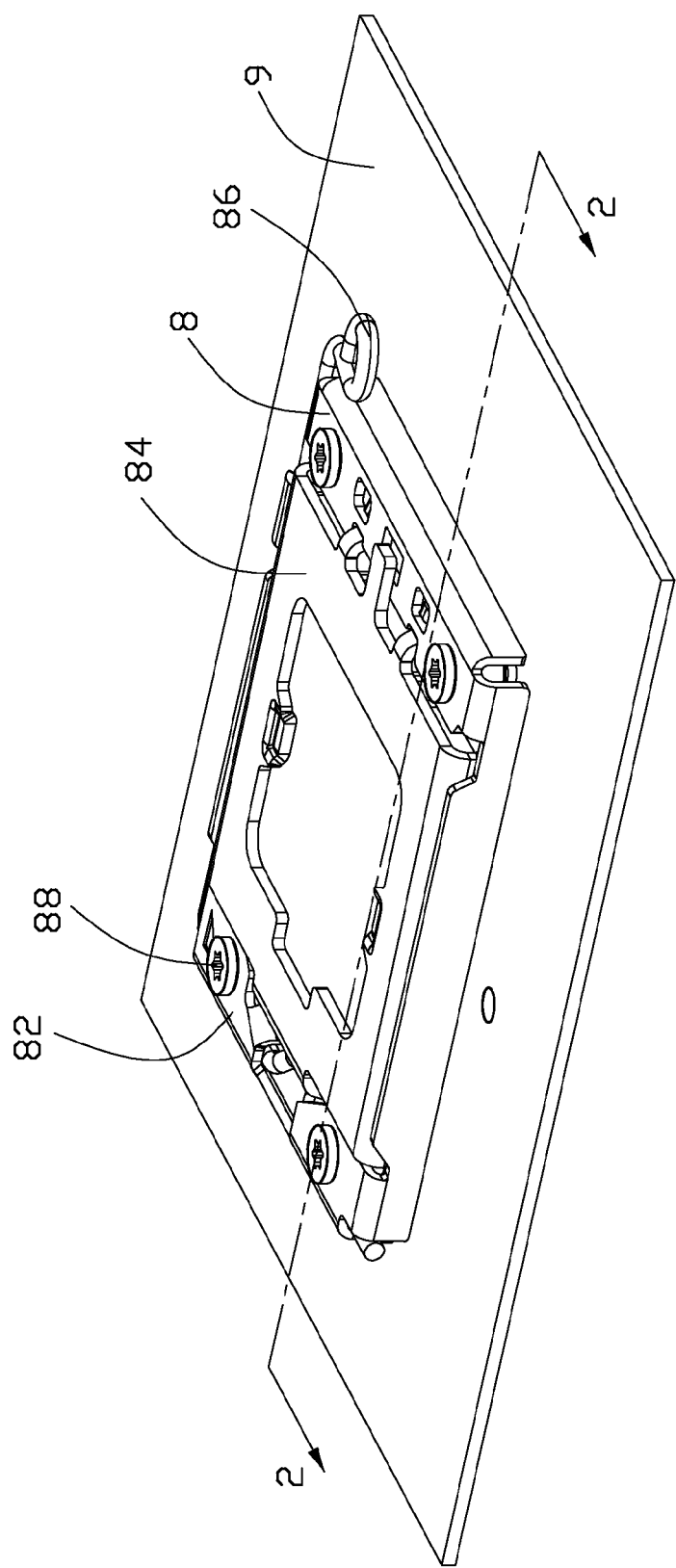
FIG. 1 is an isometric, assembled view of a conventional socket connector.
Figure 2:
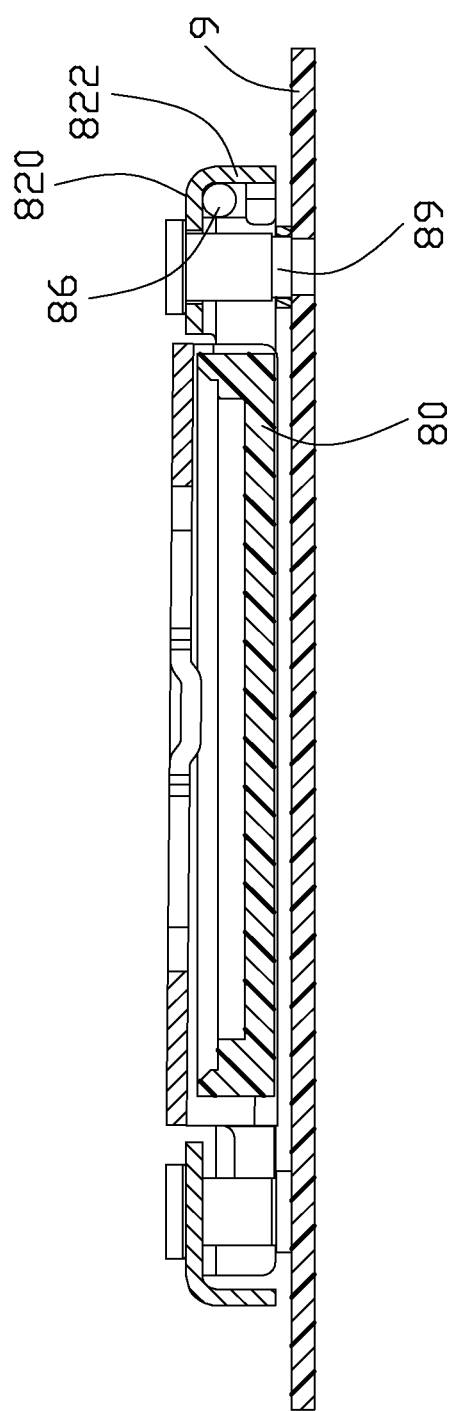
FIG. 2 is a cross-sectional view of the socket connector taken along line 2-2 shown in FIG. 1.
Figure 3:
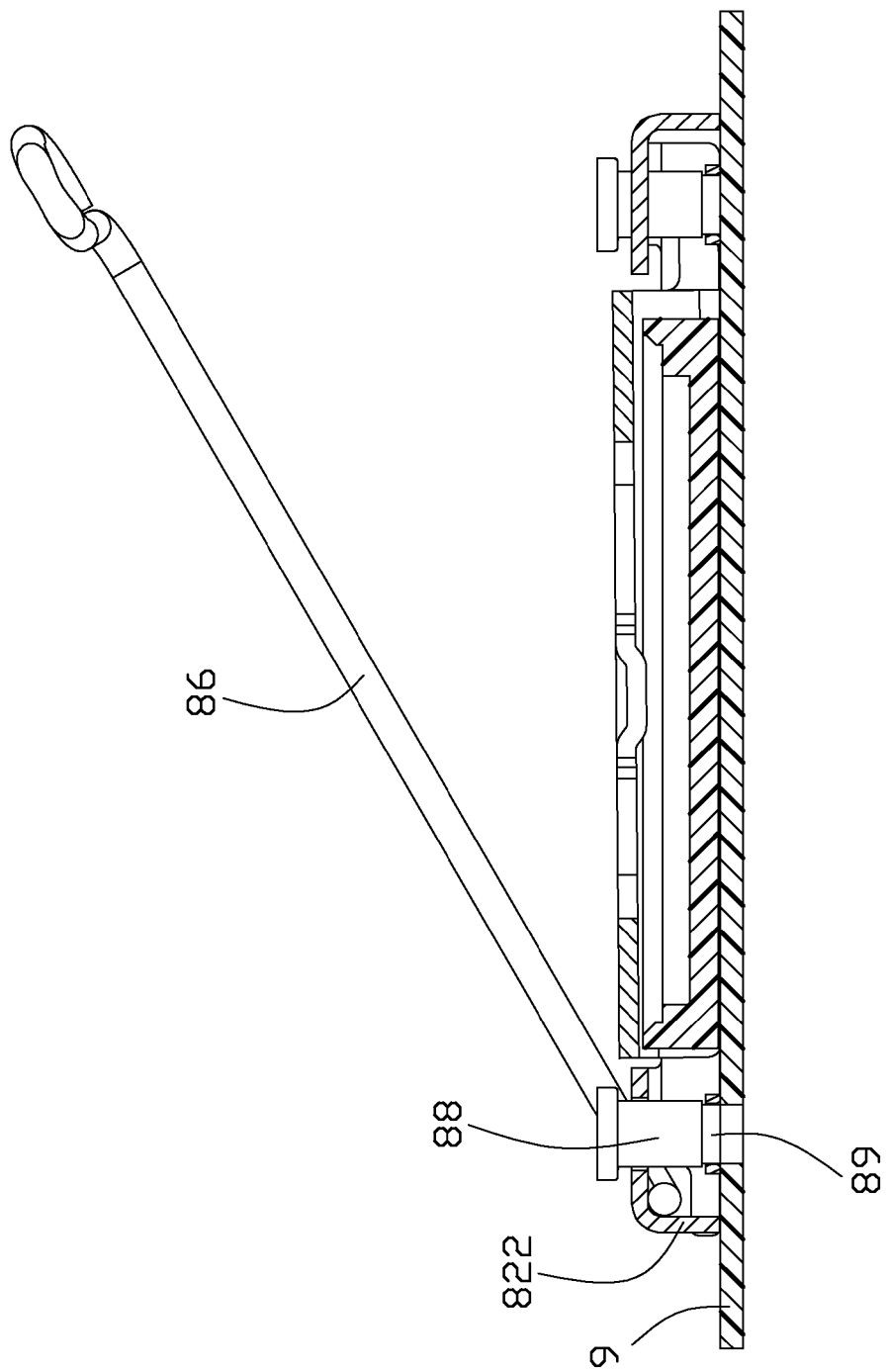
FIG. 3 is a cross-sectional view of the socket connector show in FIG. 1, wherein the loading plate is not locked.
Figure 4:
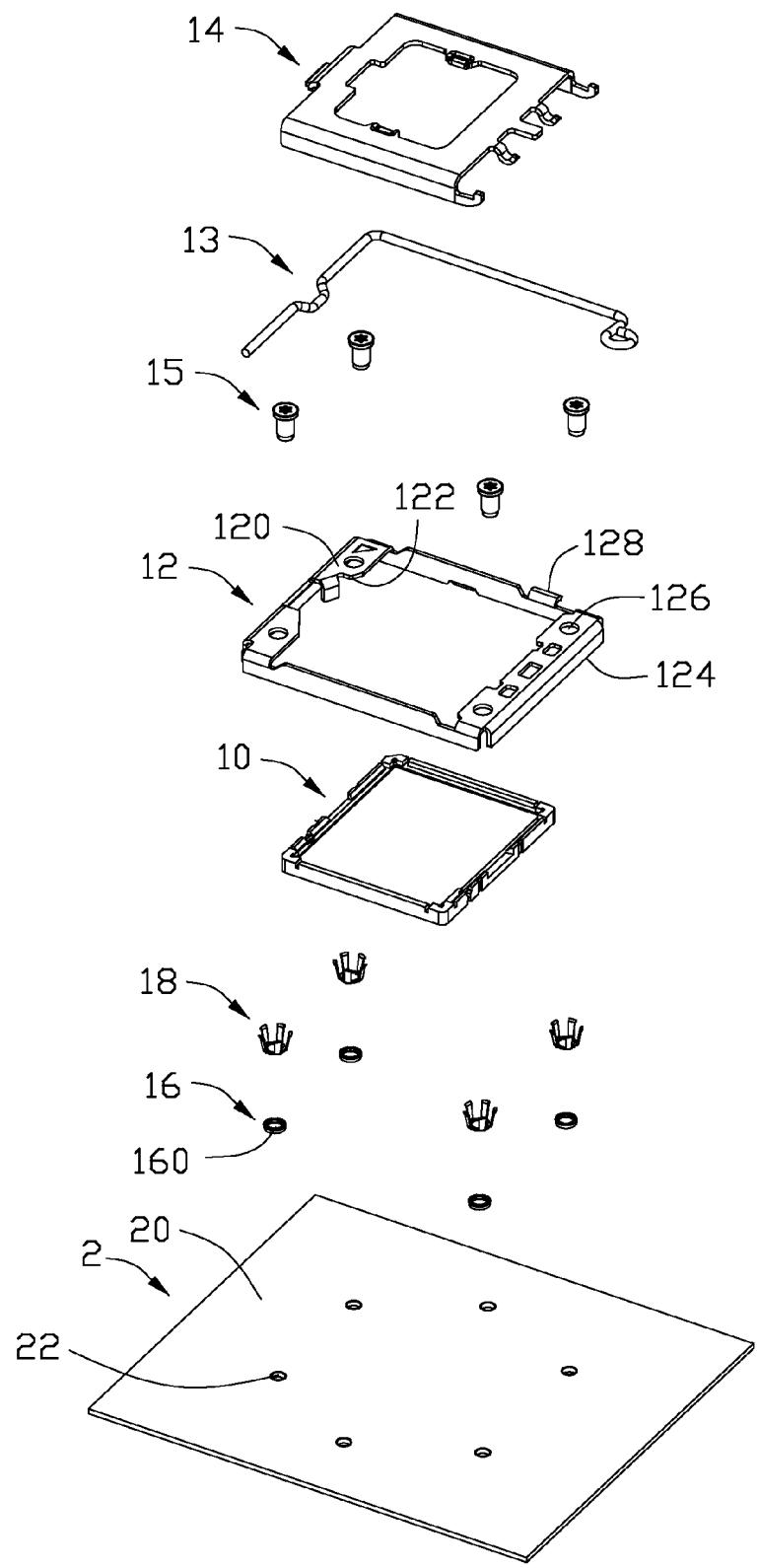
FIG. 4 is an isometric, exploded view of a socket connector in accordance with a preferred embodiment of the present invention.
Figure 5:
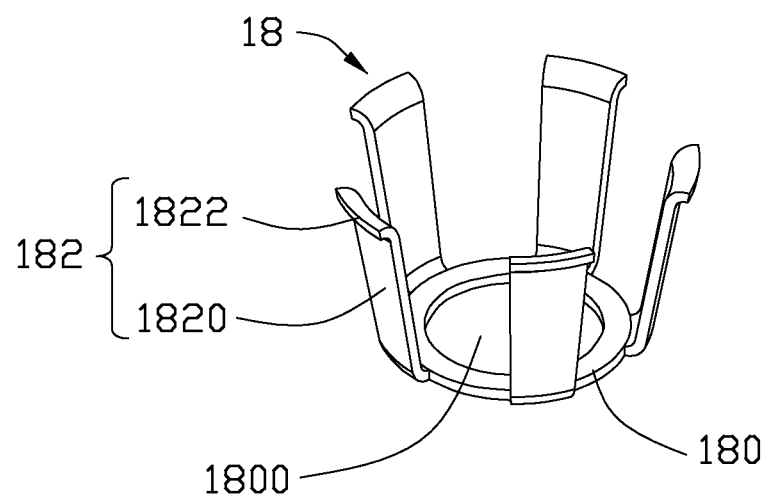
FIG. 5 is an isometric view of reinforcing member shown in FIG. 4.

Reference will now be made to the drawings to describe the present invention in detail.

Referring to FIGS. 4-10, a socket connector 1 mounted on a motherboard 2 for electrically connecting an IC package (not shown) is shown. The socket connector 1 comprises an insulative housing 10 having a number of contacts (not shown) received therein, a frame 12 seated around and individual from the housing 10, a lever 13 and a loading plate 14 pivotally connected on opposite ends of the frame 12, and a number of screw members 15, a number of connecting members 16, and a number of reinforcing members 18.

The number of contacts received in the housing 12 will be soldered to the motherboard 2. Before the socket connector 1 is mounted onto the motherboard 2, the frame 12 is free to move relative to the housing 10. The frame 12 defines opposite top, bottom face 120, 122, and a number of mounting holes 126 extending through both the top and bottom faces. The frame 12 defines a pair of sidewalls 124 extending downwardly from opposite edges of the upper face 120. The bottom end of the sidewall 124 is lower than any other portions of the frame 12 in vertical direction.

The lever 13 and loading plate 14 are pivotally connecting to opposite ends of the frame 12 and can rotate between an open position and a closed position respectively. When the lading plate 14 and the lever 13 are moved to their closed position and the lever 13 engages with an anchor 128 on the frame 12, the loading plate 14 is locked on the frame 12.

The number of screw members 15 each is passed through a mouthing hole 126 from side of the top face 120 of the frame 12. The connecting member 16 is generally of a shape of cylindrical and defines a positioning hole 160 in a middle portion thereof corresponding to the mounting hole 126. The connecting member 16 is disposed under the bottom face 122 and engaged with the screw member 15 for preventing the connecting member 16 falling from the frame 12. The screw member 15 will engage with hole 22 of the motherboard 2 so as to position the frame 12 on the motherboard 2. After the frame 12 is mounted on the motherboard 2, the frame 12 is moveable relative to the motherboard 2 in the vertical direction under a condition in which the IC package is not secured in the housing 10 by such loading device.

Advantage of the presentation is drawn to the reinforcing member 18. The reinforcing member 18 is disposed between the connecting member 16 and the bottom face 122 of the frame 12 for supporting the frame 12, so as to limit the movement of the frame 12 in the vertical direction. The reinforcing member 18 comprises a base 180 seated on upper end of the connecting member 16, a number of spring arms 182 extending upwardly from the base 180 for supporting the frame 12. The base 180 defines an opening 1800 corresponding to the screw member 15. The spring arms 182 each comprises a vertical extending section 1820 and a horizontal abutting section 1822 disposed at a distal end of the extending section 1820. The spring arms 182 are evenly disposed around the opening 1800. Accordingly, before the frame 12 is mounted on the motherboard 2, the movement of the frame 12 in the vertical direction is limited.

Figure 6:
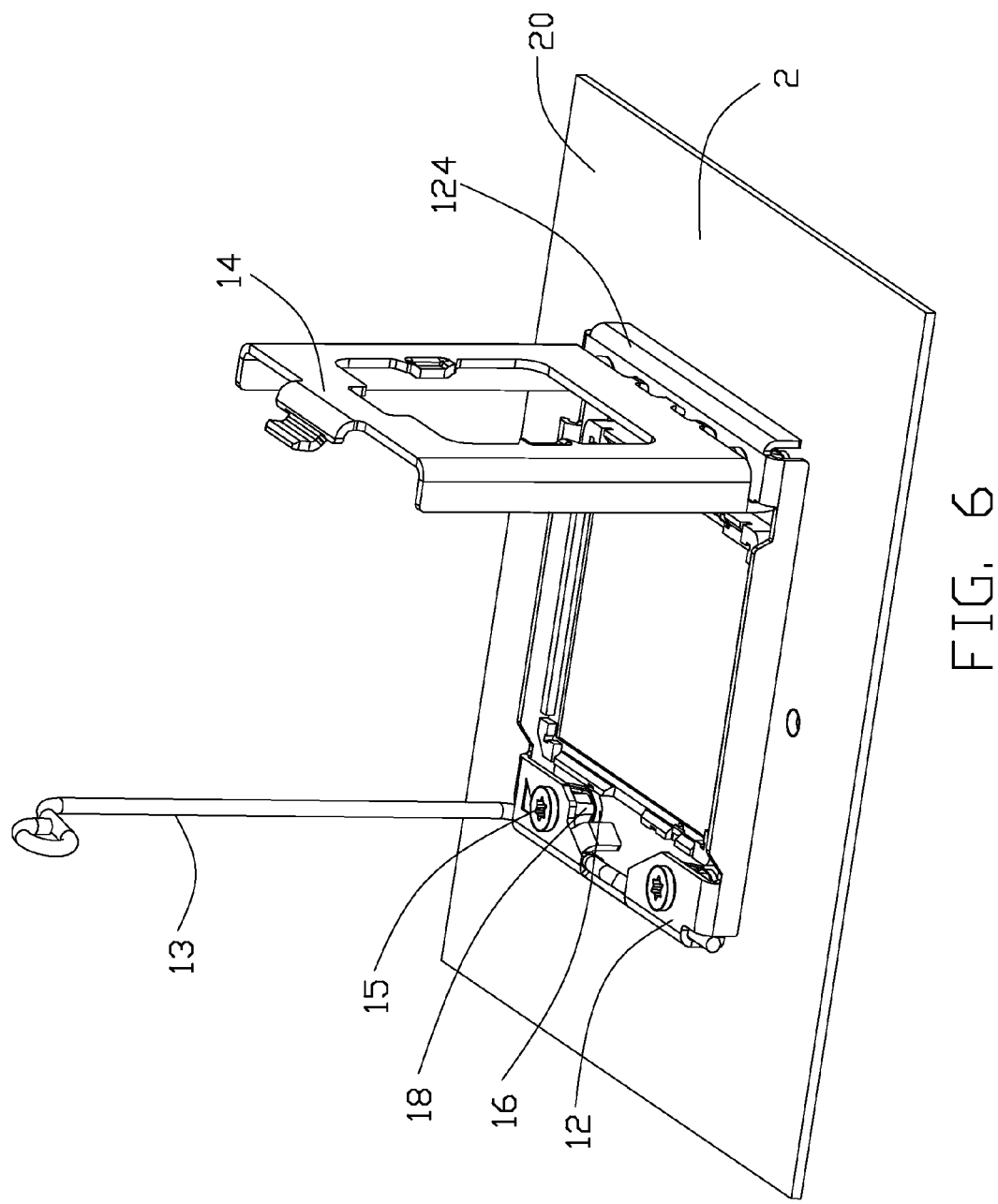
FIG. 6 is an isometric, assembled view of socket connector of the present invention; wherein the loading plate is at an opening status.
Figure 7:
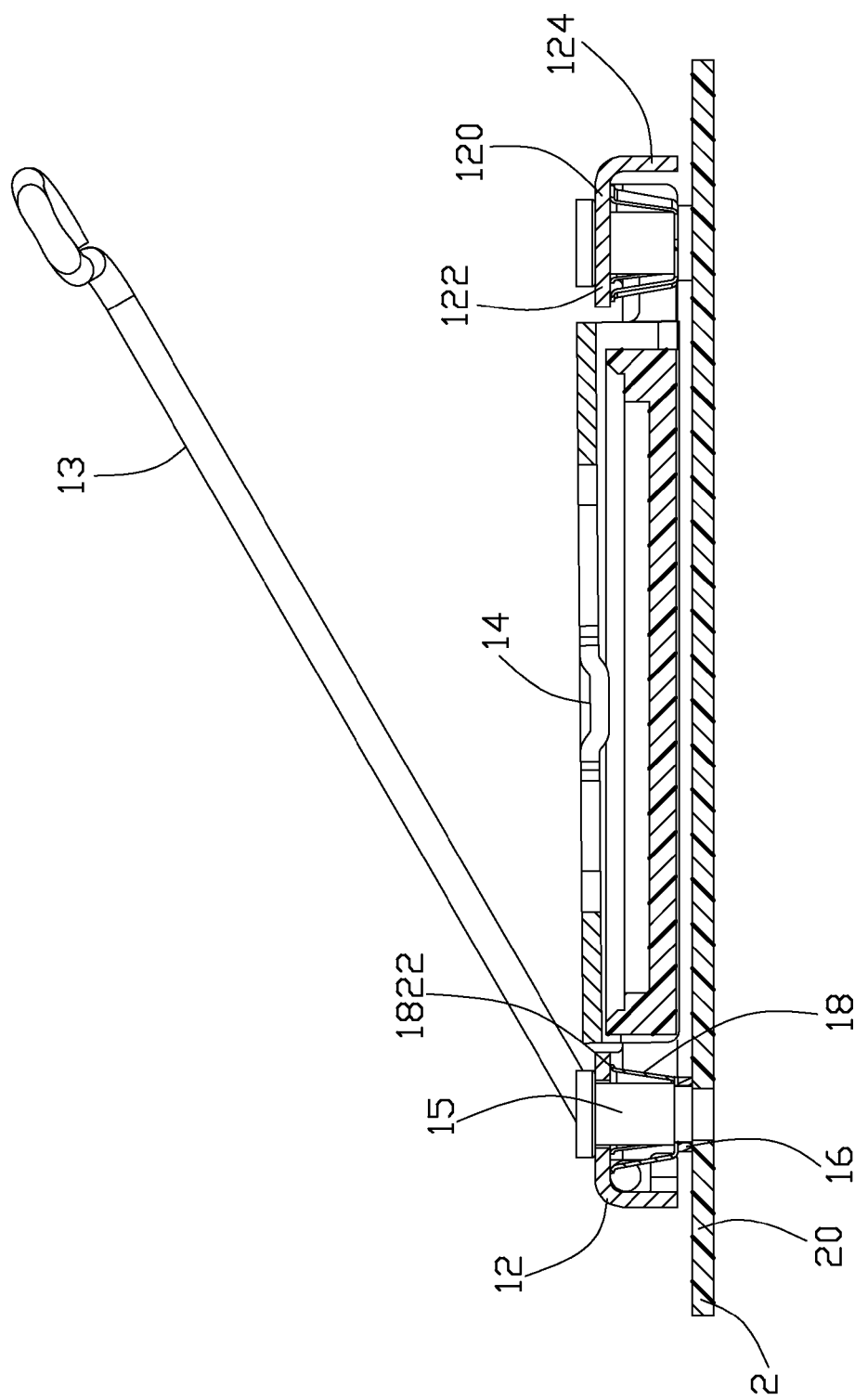
FIG. 7 is a cross-sectional view of the socket connector shown in FIG. 6, wherein the loading plate is not locked.
Figure 8:
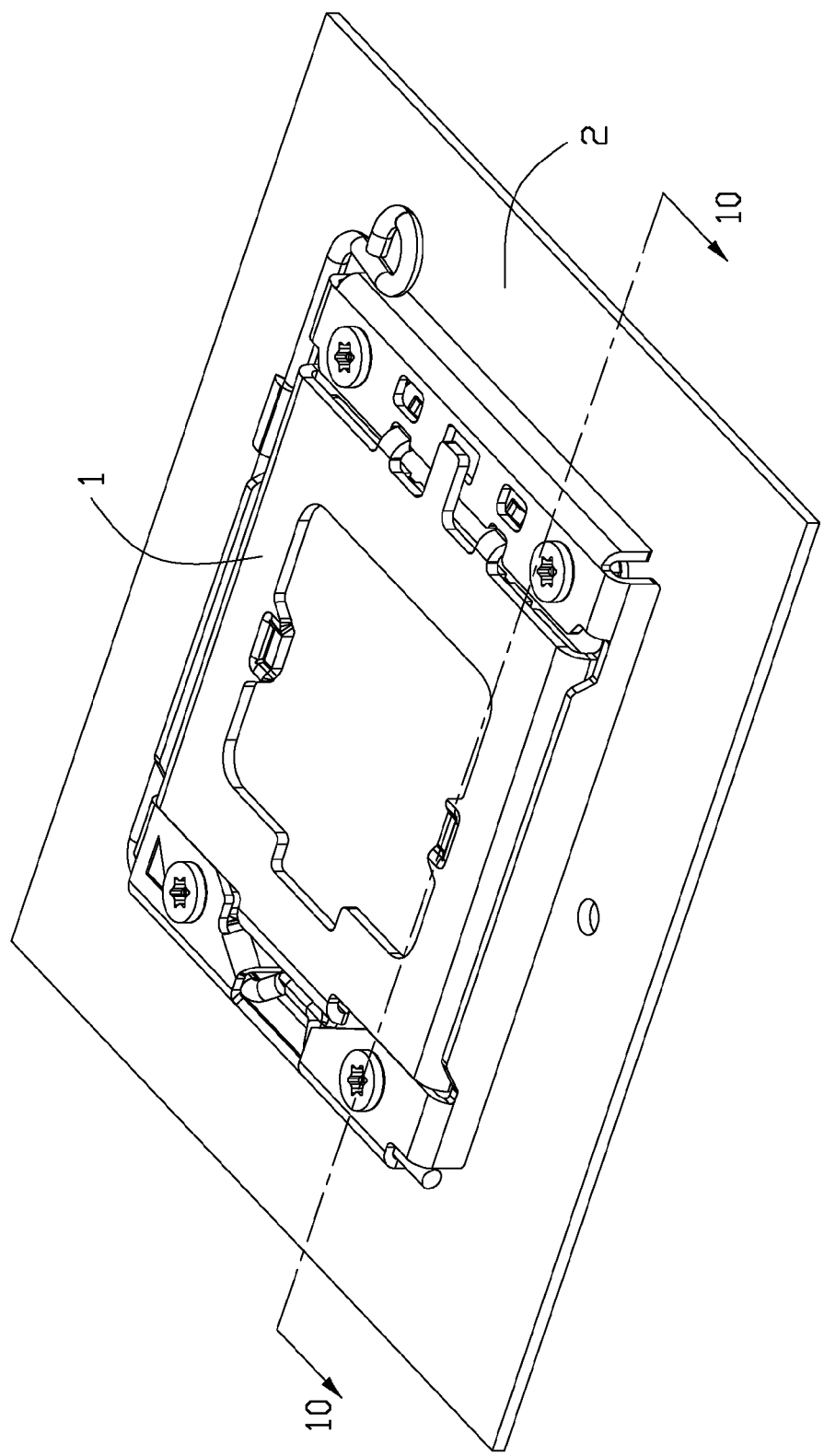
FIG. 8 is an assembled view of the socket connector and the motherboard.
Figure 9:
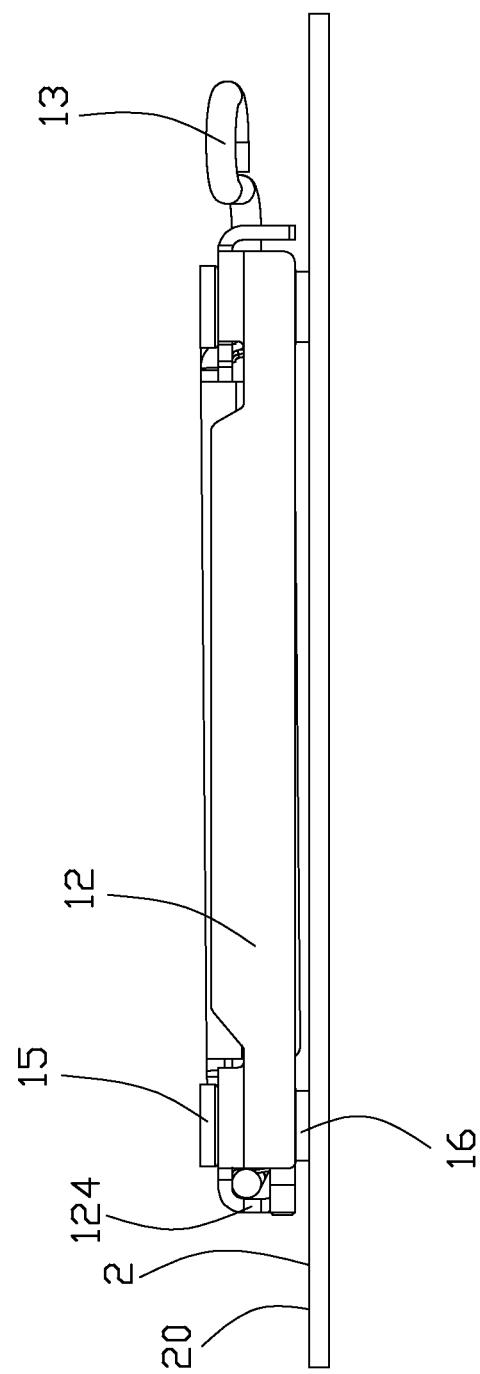
FIG. 9 is a side view of assembly shown in FIG. 8.
Figure 10:
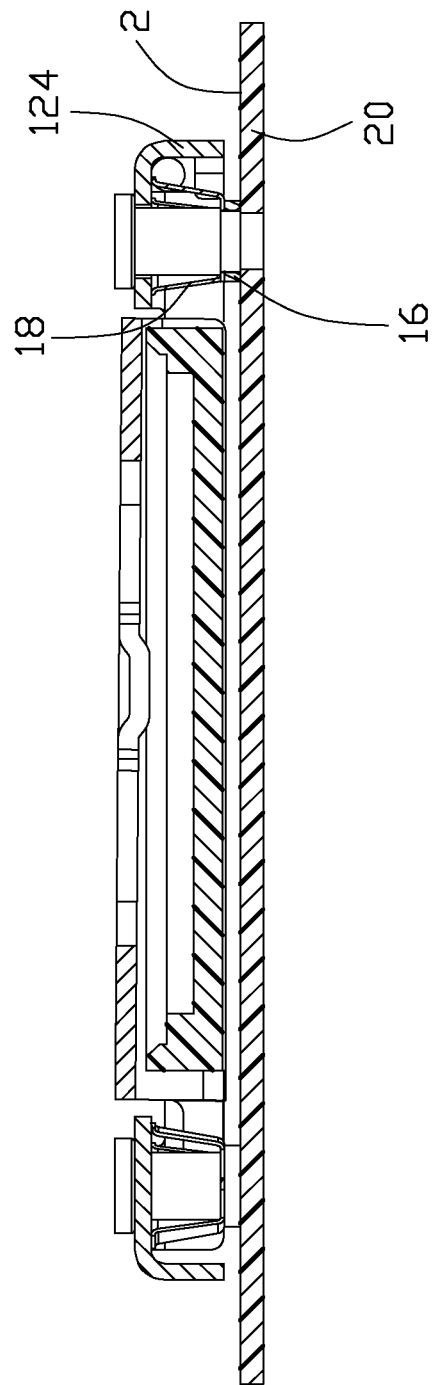
FIG. 10 is a cross-sectional view taken along line 10-10 shown in FIG. 8.

After the housing 10 and the frame 12 are seated on the motherboard 2. The frame 12 is seated around the housing 10. The motherboard 2 defines an upper surface 20 having a through hole 22 engageable with the screw member 15. In assembly of the socket connector 1 and the motherboard 2, the spring arms 182 abut against the bottom face 122 of the frame, thereby defining a space between bottom end of the sidewalls 124 of the frame 12 and the upper surface 20 of the motherboard 2. Referring to FIGS. 6-7, when both or one of the lever 13 and loading plate 14 is moved to the open position, bottom end of the connecting member 16 is flush to the upper surface 20 of the motherboard 2 and a space is defined between the bottom end of the sidewalls 124 and the upper surface 20 of the motherboard 2. In other words, before the IC package is secured in the housing 10 by the loading device, the frame 12 will not contact with the motherboard 2. Referring to FIGS. 8-10, as the conventional socket connector 8, when the loading plate 14 is locked on the frame 12 by the lever 13; a space is defined between the bottom portion of the sidewalls 124 and the upper surface 20 of the motherboard 2. The connecting member 16 is completely located below the bottom portion of the sidewall 124. In a word, according to the present invention, due to the reinforcing member 18, the frame 12 of the socket connector 1 will not contact the motherboard 2 under any condition. Thus, the motherboard 2 will avoid being damaged by the frame 12.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. A loading device, comprising:
   a frame defining opposite top, bottom face, and a number of mounting holes extending through both the faces;
   a loading plate and a lever pivotally connected on the frame respectively, the loading plate being able to be locked on the frame by the lever;
   a number of screw members passing through corresponding mounting holes;
   a number of connecting members located below the bottom face of the frame and engaging with corresponding screw member; and
   a number of reinforcing members disposed between the bottom face and the connecting members to limit movement of the frame relative to the connecting members, wherein the reinforcing member comprises a base and a number of spring arms extending upwardly from the base.

2. The loading device as claimed in claim 1, wherein the spring arm comprises a vertical extending section extending from the base and a horizontal abutting section disposed at a distal end of the extending section.

3. The loading device as claimed in claim 1, wherein the base defines a through hole in a middle portion thereof corresponding to the screw member.

4. The loading device as claimed in claim 1, wherein the base of the reinforcing member is seated on upper end of the connecting member.

5. The loading device as claimed in claim 4, wherein the frame defines a pair of sidewalls extending from opposite edges of the top face of the frame.

6. The loading device as claimed in claim 5, wherein bottom end of the connecting member is located below the bottom end of the sidewalls of the frame.

7. A socket connector assembly for interconnecting two electronic components, comprising:
   a motherboard defining opposite upper, lower surface and a number of through holes;
   a socket connector comprising: a housing seated on the upper surface of the motherboard; a frame separated from the housing and defining opposite top, bottom face, and a number of mounting holes extending through both the faces corresponding to the through holes of the motherboard;
   a loading plate and a lever pivotally connected on the frame respectively, the loading plate being able to be locked on the frame by the lever;
   a number of screw members passing through corresponding mounting holes and engaging with corresponding through holes;
   a number of reinforcing members disposed between the bottom face of the frame and upper surface of the motherboard so as to define a space between bottom end of the frame and upper surface of the motherboard; and
   a number of connecting members disposed between the bottom face of the frame and the upper surface of the motherboard and having a bottom end seated on the upper surface of the motherboard;
   wherein the reinforcing member is disposed between the connecting member and bottom face of the frame and the reinforcing member comprises a base and a number of spring arms extending upwardly from the base.

8. The socket connector assembly as claimed in claim 7, wherein the spring arm comprises a vertical extending section extending from the base and a horizontal abutting section disposed at a distal end of the extending section.

9. The socket connector assembly as claimed in claim 8, wherein the base defines a through hole in a middle portion thereof corresponding to the screw member.

10. The socket connector assembly as claimed in claim 7, wherein the base of the reinforcing member is seated on upper end of the connecting member.

11. The socket connector assembly as claimed in claim 10, wherein the frame defines a pair of sidewalls extending from opposite edges of the top face of the frame.

12. The socket connector assembly as claimed in claim 11, wherein bottom end of the connecting member is located below the bottom end of the sidewalls of the frame.

13. An electrical connector assembly comprising:
- a printed circuit board defining an upward mounting face;
- a socket mounted upon the mounting face and including: an insulative housing with contacting therein; a frame located around the housing;
- a load plate and a lever pivotally mounted to the frame at two positions by two opposite sides of the housing; and
- a plurality of fastening structures securing the frame to the printed circuit board, each of said fastening structures including a screw cooperating with an up and down deformable reinforcing member which provides vertical support between an underside of the frame and the mounting face of the printed circuit board;
- wherein said reinforcing member defines a base with a plurality of spring arms unitarily extending from a periphery of the base and away from the base axially and radially, and either the base or free ends of said spring arms abuts against the underside of the frame.

14. The electrical connector assembly as claimed in claim 13, wherein each of said fastening structures further including a connection member which is directly seated upon the mounting face of the printed circuit board and sandwiched between the reinforcing member and the printed circuit board.

* * * * *